United States Patent [19]

Carter et al.

[11] Patent Number: 4,886,646
[45] Date of Patent: Dec. 12, 1989

[54] HANGING DROP CRYSTAL GROWTH APPARATUS AND METHOD

[75] Inventors: Daniel C. Carter, Huntsville, Ala.; Robbie E. Smith, Fayetteville, Tenn.

[73] Assignee: The United States of America as represented by the Administrator of the National Aeronautics and Space Administration, Washington, D.C.

[21] Appl. No.: 172,101

[22] Filed: Mar. 23, 1988

[51] Int. Cl.$^4$ .............................................. C30B 7/02
[52] U.S. Cl. ........................... 422/245; 156/DIG. 62; 156/DIG. 72; 156/608; 156/600
[58] Field of Search ......................... 422/101, 245, 70; 435/101, 174; 156/608, DIG. 72, 607, DIG. 62; 204/402, 73; 540/465; 202/197; 55/97, 87, 178

[56] References Cited

U.S. PATENT DOCUMENTS 4,263,010  4/1981  Randolph ............................ 422/245
4,755,363  7/1988  Fujita et al. ......................... 422/245

Primary Examiner—John Doll
Assistant Examiner—M. Franklin
Attorney, Agent, or Firm—William J. Sheehan; John R. Manning; Charles E. B. Glenn

[57] ABSTRACT

An apparatus (10) is constructed having a cylindrical enclosure (16) within which a disc-shaped wicking element (18) is positioned. A well or recess (22) is cut into an upper side (24) of this wicking element, and a glass cover plate or slip (28) having a protein drop disposed thereon is sealably positioned on the wicking element (18), with drop (12) being positioned over well or recess (22). A flow of control fluid is generated by a programmable gradient former (16), with this control fluid having a vapor pressure that is selectively variable. This flow of control fluid is coupled to the wicking element (18) where control fluid vapor diffusing from walls (26) of the recess (22) is exposed to the drop (12), forming a vapor pressure gradient between the drop (12) and the control fluid vapor. Initially, this gradient is adjusted to draw solvent from the drop (12) at a relatively high rate, and as the critical supersaturation point is approached (the point at which crystal nucleation occurs), the gradient is reduced to more slowly draw solvent from the drop (12). This allows discrete protein molecules more time to orient themselves into an ordered crystalline lattice, producing protein crystals which, when processed by X-ray crystallography, possess a high degree of resolution.

16 Claims, 4 Drawing Sheets

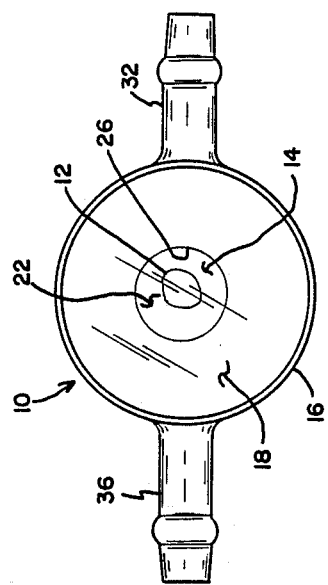
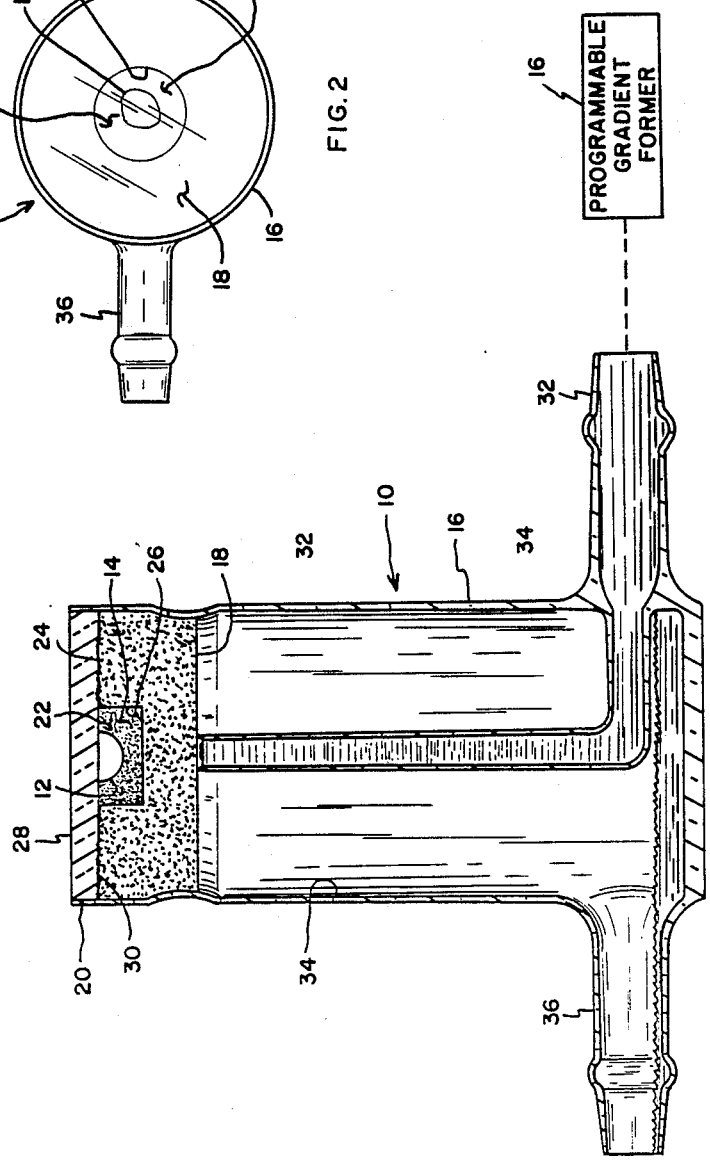
FIG. 2
FIG. 1

HANGING DROP CRYSTAL GROWTH APPARATUS AND METHOD

ORIGIN OF THE INVENTION

The invention described herein was made by employees of the U.S. Government and may be manufactured and used by or for the Government for Government purposes without the payment of any royalties thereon or therefor.

TECHNICAL FIELD

This invention relates generally to hanging drop crystal growth methods and devices, and more particularly to a crystal growth apparatus wherein evaporation rate of solvent in a hanging drop containing dissolved protein is precisely controlled by a flow of control fluid made to have a variable vapor pressure.

BACKGROUND OF THE INVENTION

One of the major limiting steps in the determination of three-dimensional structures of macromolecules by the technique of X-ray diffraction is the ability to grow relatively large (0.5 mm) high-quality (diffraction limit of 3 angstrom units or better) crystals of the macromolecules of interest. A knowledge of the three-dimensional structures of various enzymes has great potential in the area of drug design, i.e., development of new enzyme inhibitors, and is of fundamental importance in the field of molecular biology.

Recently, researchers involved in protein crystal growth have reported growing protein crystals in a microgravity environment that are many times larger than similar crystals grown in a gravity environment. They used a method known as diffusive mixing, wherein a solution containing dissolved protein is allowed to mix with a solution containing a dissolved solvent and precipitating agent. As there are no disruptive convection currents in a microgravity environment, mixing of the two solutions is achieved by diffusion, allowing a slower approach to the critical supersaturation of the dissolved protein, causing larger crystals to be grown. For more information on growing protein crystals in a microgravity environment, see "Protein Single Crystal Growth Under Microgravity," by W. Littke and C. John in *Science*, 1984, Vol, 225, page 203.

Another similar diffusive method of growing crystals is the liquid diffusion method in which a solution containing dissolved protein to be crystallized is placed in a dyalysis bag. This bag is constructed of a semi-permeable membrane which will allow smaller solvent and precipitating agent molecules to pass through but blocks larger protein molecules. This bag is immersed in a solution containing a precipitating agent for the protein, which then diffuses through the bag and lowers the solubility of the protein. As the saturation point of the dissolved protein is approached, crystal nucleation occurs, creating tiny nucleii of crystals around which additional crystalline material is deposited.

Problems with this method are that no provisions are made to control the rate at which critical supersaturation is approached. Thus, the rate of crystal growth cannot be precisely controlled, often resulting in numerous smaller crystals being formed having a structure that is something less than ordered. These crystals do not provide resolution necessary under X-ray crystallography to adequately determine their molecular structure.

One of the most popular crystal growth methods, known as the hanging drop method, involves the placement of a small droplet of protein solution on a glass cover slip, with this cover slip being inverted over a well of solution and sealed. The solution in the well contains a precipitating agent that is also present at a lower concentration in the protein droplet (usually 50% of the reservoir concentration). The function of the precipitating solution is twofold. First, the solution in the well is initially at a lower vapor pressure than the protein droplet. Evaporation then proceeds at a rate fixed by the difference in vapor pressure between the protein droplet and the reservoir and the distance the vapor must diffuse. Second, the precipitating agent lowers the solubility of protein in solution, presumably by competing with the protein for available solvent (usually water).

Thus, as evaporation from the protein droplet progresses, the solution becomes supersaturated with protein. under appropriate conditions of pH, temperature, etc., crystallization of the protein or macromolecule then occurs. The exact conditions for crystallization are established by trial and error, with serendipity often being an important factor. A review and a more in-depth description of the vapor diffusion method, as well as other protein crystallization techniques, may be seen in *Preparation and Analysis of Protein Crystals*, by A. McPherson (1982), Wiley, New York. Again, problems with this method are a lack of control over the rate at which drop size is changed and the inability to reverse the process to increase drop size.

Applicants' device as described herein controls vapor pressure, in turn determining crystal growth rate, in a crystal growth apparatus utilizing the hanging drop method. It has been shown that nucleation rate and crystal size are highly dependent upon the rate at which critical supersaturation is approached. Slow approach to critical supersaturation shows a marked decrease in crystal nucleation rate and a corresponding increase in crystal size and quality.

It is, therefore, an object of this invention to provide a crystal growth apparatus for allowing researchers to controllably approach critical supersaturation in a hanging drop containing dissolved protein material. This is done by either adding or removing solvent in a vapor phase to or from the hanging drop.

SUMMARY OF THE INVENTION

In accordance with this invention, a crystal growth apparatus is constructed having an enclosure which houses a wicking element. This wicking element is provided with a flow of control fluid generated by a device that selectively and controllably alters parameters of the control fluid and thus vapor therefrom. This vapor is exposed to a quantity of fluid containing dissolved crystalline material and interacts therewith to controllably lower the solubility of the dissolved crystalline material, causing it to slowly solidify into relatively large crystals having an ordered structure.

BRIEF DESCRIPTION OF THE DRAWINGS

FIG. 1 is a cut-away view of a crystal growth apparatus of the present invention.

FIG. 2 is a top view of the crystal growth apparatus as shown in FIG. 1.

DESCRIPTION OF THE PREFERRED EMBODIMENT

Figure 5:
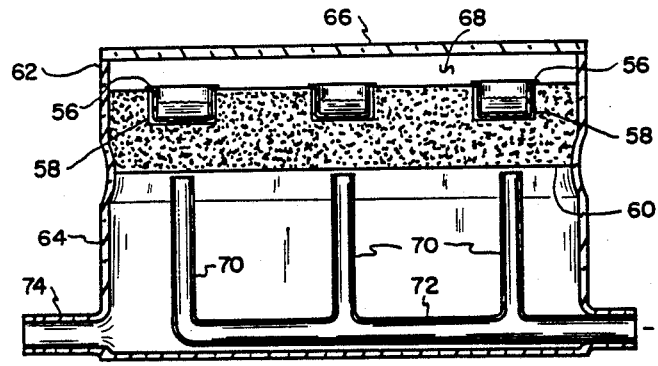
FIG. 5 is a cut-away view of an alternate embodiment of the present invention.

Referring to FIGS. 1 and 2, a crystal growth apparatus 10 is shown which regulates the evaporation rate of solvent from a suspended drop 12 of fluid. Drop 12 contains dissolved crystalline material, usually a protein of interest, and a selected quantity of precipitating agent specific for the crystalline material. This process changes the size of drop 12 by evaporation, and, as the concentration of dissolved crystalline material and precipitating agent is inversely proportional to drop size, increasing or decreasing drop size by adding or subtracting solvent thereto respectively decreases or increases the concentration of dissolved crystalline material and precipitating agent.

Apparatus 10 consists of a crystal growth chamber 14 coupled to a conventional programmable gradient forming apparatus 16. Gradient former 16 is of the type used in the field of liquid chromatography and functions to regulate the concentration of a substance such as a precipitating agent or a pH altering agent in a flow of solvent. This solvent, or control solution, when exposed to drop 12, establishes a vapor pressure gradient between itself and drop 12. Thus, if the control solution has a low vapor pressure and drop 12 has a higher vapor pressure, solvent will evaporate and pass from drop 12 into the control solution. Conversely, if drop 12 has a lower vapor pressure than the control solution, solvent will evaporate from the control solution and be absorbed into drop 12. In this manner, solvent is added to or subtracted from drop 12 by evaporation or absorption to decrease or increase concentration of dissolved crystalline material therein. The control fluid is provided as a continuous flow to crystal growth chamber 14 where vapor therefrom is exposed to drop 12. As is known, if the critical supersaturation point of dissolved protein in drop 12 can be slowly and controllably approached, fewer nucleation sites of crystalline material will form, which aids in forming fewer and larger crystals which possess a highly ordered structure. Accordingly, once the protein solution in drop 12 achieves a desired concentration (generally slightly supersaturated), growth rate of crystals formed therein is regulated by maintaining this concentration throughout the growth phase of the crystals.

As shown in FIGS. 1 and 2, crystal growth apparatus 10 consists of a container 16 provided with a disc-shaped wicking element 18 constructed of an absorbent vapor diffusion means which consists of an inert absorbent material, such as sintered glass. Disc 18 is fitted into an upper, open top side 20 of container 16 and has a well or recess 22 cut into an upper side 24 thereof. This well provides clearance for drop 12 while allowing drop 12 to be positioned closely proximate to walls 26 of well 22. Due to the sintered glass configuration of walls 26, a large surface area is provided from which vapor may diffuse to and from drop 12. Drop 12 is suspended from a cover plate 28 supported by disc 18 and is sealed from ambient atmospheric gases by a layer of sealant 30, such as an inert silicone grease, which is positioned between cover plate 28 and disc 18. An inlet tube 32 coupled to gradient former 16 (not shown in FIG. 2) provides the flow of control fluid which, due to capillary action, is continuously wicked into disc 18. Spent control fluid flowing from disc 18 drains down side 34 of container 16 and is directed out of container 16 by an outlet tube 36.

Figure 4:
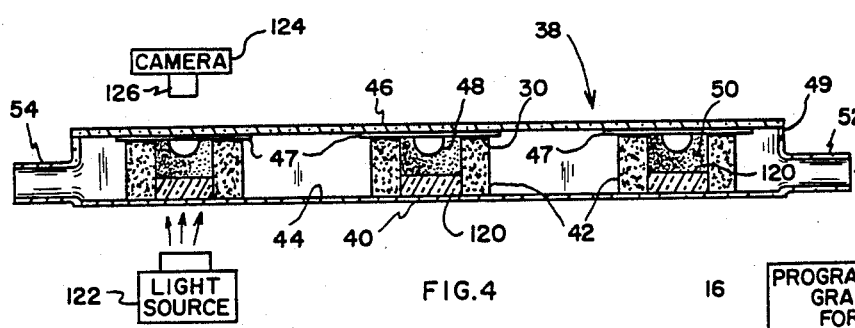
FIG. 4 is a sectional view taken along line 4—4 of FIG. 3.
Figure 3:
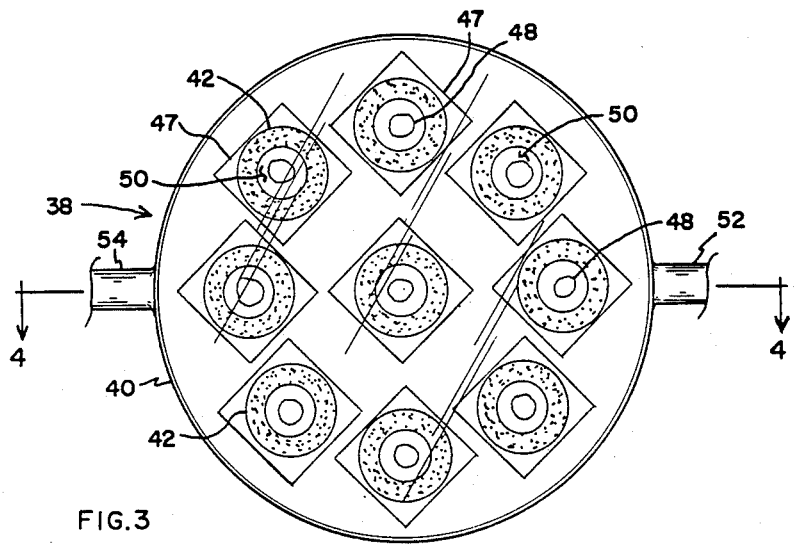
FIG. 3 is a top view of a crystal growth apparatus for growing crystals in a plurality of hanging drops.

As an alternate embodiment to the present invention, FIGS. 3 and 4 illustrate a crystal growth apparatus 38 in which a container 40 is shorter in height, with a plurality of sintered glass discs 42 resting on an interior bottom surface 44 of container 40. A cover slip 47 having a protein drop 48 disposed in suspended relation therefrom is sealed as described over each of discs 42 and wells 50. A cover plate 46 is then positioned over open upper side 49 of container 40. Inlet tube 52 is coupled to programmable gradient former 16 and allows the control fluid to be passed into container 40 where it circulates through and around discs 42. Outlet tube 54 allows the spent control fluid to be passed out of container 40.

For growing crystals in larger quantities of fluid, FIG. 5 illustrates an embodiment of this invention in which a plurality of beakers 56 containing fluid within which crystals are grown are positioned in openings 58 of a sintered glass disc 60. Disc 60 is placed in an open upper side 62 of a container 64, with a cover plate 66 being positioned over disc 40 a spaced distance to provide a vapor diffusion region 68 between plate 66 and beakers 56. Control fluid is conveyed to disc 60 by a plurality of tubes 70 which branch from a supply tube 72, in turn coupled to programmable gradient former 16. Container 64 is also provided with an outlet tube 74 through which spent control fluid exits.

Figure 6:
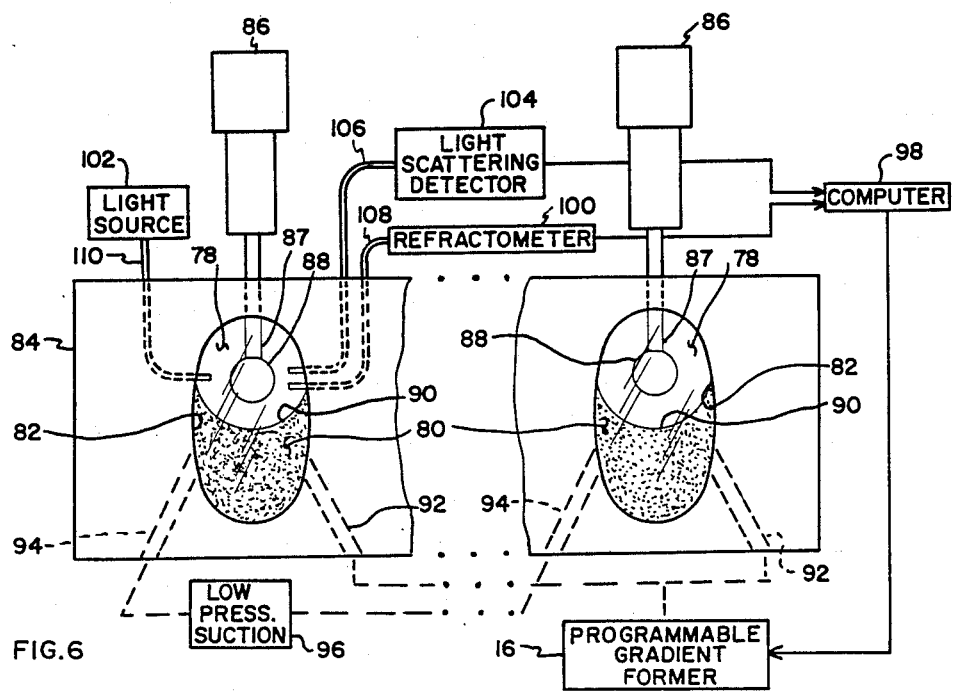
FIG. 6 is a side planar view of a crystal growth apparatus of the present invention for use in a microgravity environment.

For use of this type apparatus in a microgravity environment, crystal growth chambers 78 are constructed as shown in FIG. 6. In this embodiment, each of growth chambers 78 contains a semi-circular sintered glass wicking element 80 positioned in a capsule-shaped cavity 82 cut into a housing 84. A syringe 86 is positioned to extrude a drop 88, which adheres to end 87 of syringe 86 and positions drop 88 closely proximate a semi-circular surface 90 of wicking element 80. Drop 88 is so positioned in order to reduce vapor diffusion time between drop 88 and element 80. An inlet tube 92 in housing 84 is coupled between sintered glass element 80 and programmable gradient former 16 and conveys a supply of control fluid to element 80. Exit tube 94 in housing 84 is coupled to a low pressure vacuum source 96 to draw spent control fluid from element 80. Vacuum source 96 actively removes control fluid from wicking element 80 to prevent the control fluid from flooding cavity 82.

Figure 7:
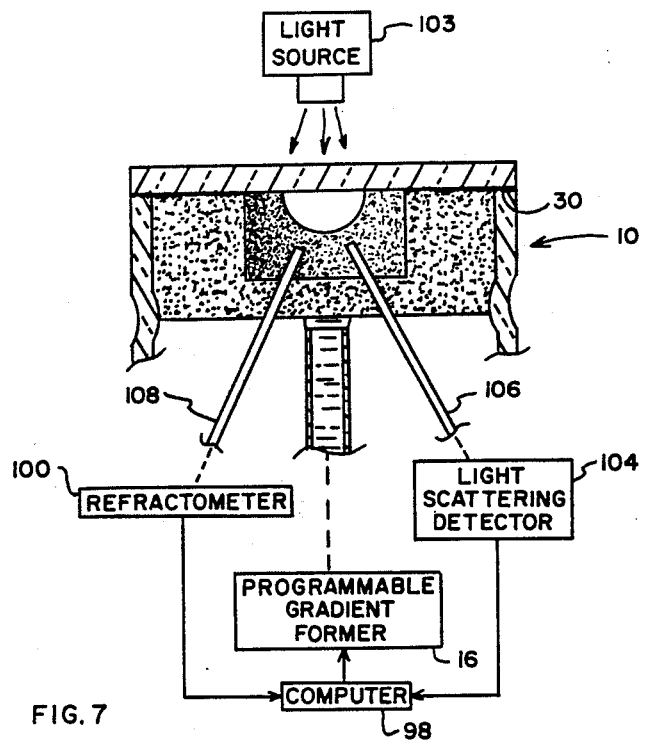
FIG. 7 is a partially diagrammatic, partially cut-away view of an alternate embodiment of the present invention.

It is to be noted that in the above described embodiments of this invention, and as shown in FIGS. 3-6, a plurality of crystal growth chambers or beakers may be incorporated in a single chamber or housing and supplied with a control fluid from a single gradient former. Additionally, and as shown in FIGS. 6 and 7, a computer 98 may be programmed to provide appropriate concentrations of control fluid responsive to conventional methods of determining concentrations of solutes in the drops, such as a refractometer 100. Refractometer 100, in conjunction with a light source 102 or 103, is used to determine these concentrations of solutes in fluids by measuring changes of refractive index of the fluid in drop 88. Still further, a light scattering detector 104 may be used to detect crystal nucleation in drops 88, which in turn may be coupled to provide an electrical output to computer 98, causing gradient former 16 to adjust the concentration of precipitating agent in the control fluid responsive to light scattering apparatus 104. As shown in FIG. 6, refractometer 100 and light scattering apparatus 104 may be coupled proximate the drops by fiber optic cables 106 and 108 to detect these changes in light (coupled via fiber optic cable 110) from light source 102. In one application, a single gradient former 16 (FIG. 6) responsive via computer 98 to a light scattering detector 104 and refractometer 100 may be coupled to a single crystal growth chamber 78 for regulating concentration of control fluid supplied to a plurality of crystal growth chambers 78. This would be done when it is desirable to screen a particular protein for crystallization parameters. Conversely (FIG. 7), a single refractometer 100 and a light scattering detector 104 may be coupled via computer 98 to a single gradient former 16 to individually control crystallization in discrete crystal growth apparatus 10.

Another method for monitoring crystal nucleation is shown in FIG. 4. In this embodiment, discs 42 are provided with a transparent glass bottom 120. A light source 122 is positioned on one side of a transparent container 40, with a camera 124 having a "macro" lens 126 being positioned on an oppposite side thereof. Camera 124 may be a video camera coupled to a monitor (not shown) or a video recorder (not shown) or may be of the still type for recording sequenced exposures.

Figure 8:
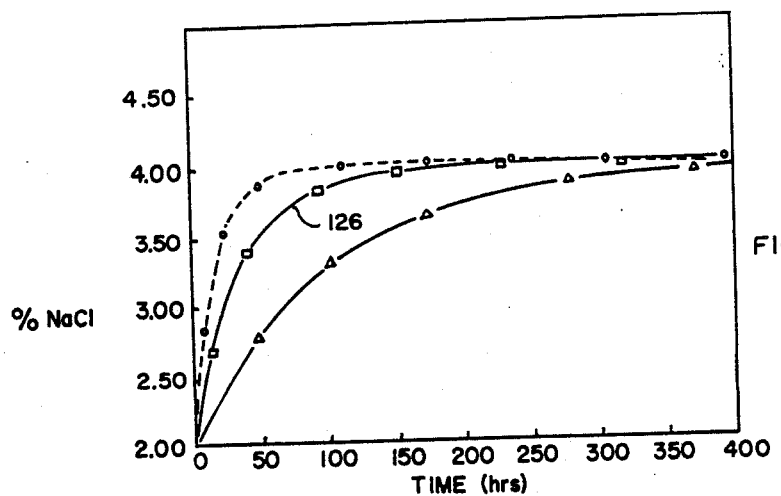
FIG. 8 is a graphic representation of three examples of rising gradients.

Operation of the described embodiments of this invention is generally dependent on how gradient former 16 is programmed to function. Three examples of one type gradient, a rising gradient, are graphially illustrated in FIG. 8. As shown, time necessary for a 2% NaCl solution to increase to 4% NaCl may be varied from 50 to over 400 hours. These type gradients are useful when it is desired to initially draw solvent from a hanging drop at a relatively high rate and thereafter reduce the rate of evaporation of solvent from the hanging drop as critical supersaturation of the subject protein is approached.

Figure 9:
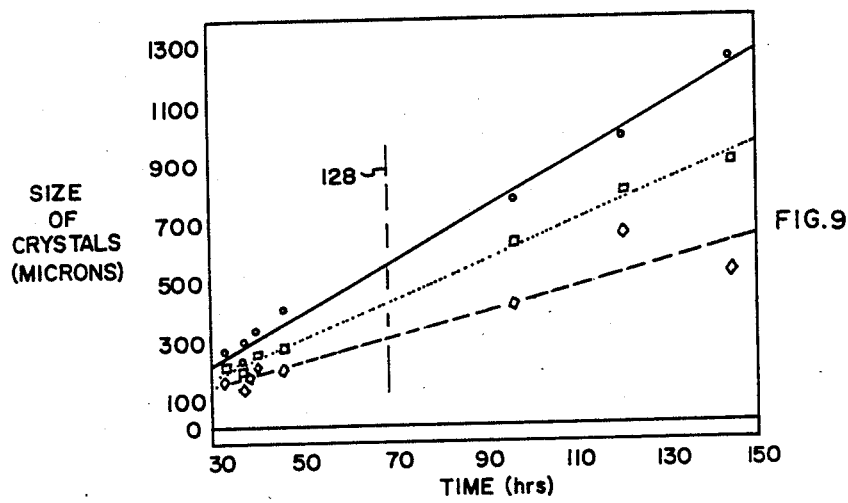
FIG. 9 is a graphic representation illustrating the differences in size between crystals grown by methods of prior art and crystals grown by an embodiment of the present invention.
Figure 10:
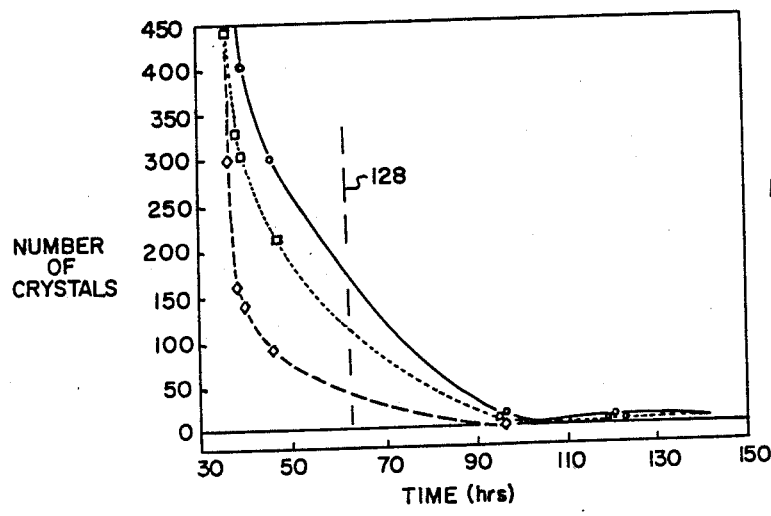
FIG. 10 is a graphic representation comparing the quantity of crystals grown by methods of prior art to the quantity of crystals grown by an embodiment of the present invention.

FIGS. 9 and 10 illustrate crystal growth results obtained in a model system consisting of protein drops formed by adding 10 microliters of a 25 mg/ml hen egg white lysozyme solution to 10 microliters of 4% (W/V) NaCl in 0.1 m sodium acetate buffer, pH4, at 25° C. The NaCl concentration in the drop is therefore initially at approximately 2% and slowly increases as it attempts to equilibrate with the gradually increasing concentration of NaCl in the control fluid. Hen egg white lysozyme crystallizes at approximately 3.9% concentration of Nacl, meaning that approximately one-half of the solvent (water) is removed in the drop to initiate crystal nucleation. For this model system, a gradient was selected which approximates gradient 126 of FIG. 8. This system grew tetragonal, prism-shaped crystals having characteristics which are graphed to the right of dotted lines 128 in the graphs of FIGS. 9 and 10. These crystals which are shown to the left of dotted lines 128 were grown by methods of prior art, which have fixed gradients of 4%. As shown, fewer and larger crystals were produced by embodiments of the present invention utilizing a gradient having a relatively slow rate (approximately 90 hours) of increasing NaCl concentration from 2% to 4%. This allows protein molecules time to orient themselves into an ordered crystalline lattice. In contrast, crystals grown by methods of prior art tend to be grown at a faster rate (less than 40 hours) as the water in the protein drop attempts to equilibriate at a constant maximum rate as set by the reservoir of 4% NaCl solution.

Crystals are grown in embodiments of the present invention by positioning a drop of fluid (FIGS. 1–4 and 7) containing dissolved protein and, in most instances, a precipitating agent, such as polyethylene glycol or ammonium sulfate, at one-half the concentration required to cause crystallization of the dissolved protein, on a cover slip 28 or 47. This cover is then placed over a sintered glass disc 18 or 42 and sealed as described by a layer 30 of inert silicone grease, with the drop suspended in a well 22 or 50 of disc 18 or 22. Inlet tube 32 or 52 of the growth chamber is coupled to gradient former apparatus 16, which is programmed to provide a flow of control fluid as described. This establishes a vapor pressure gradient between the control fluid and the fluid in the drop, causing solvent in the drop to evaporate and become incorporated into the control fluid. This reduces the size of the drop and gradually increases concentration of protein until crystallization occurs. At this point, as determined by empirical research or by refractometer 100 (FIGS. 6 and 7), gradient former 16 is adjusted to optimize conditions of crystallization. The time required for evaporation of solvent from the drop to cause the protein to become concentrated to the saturation point is variable, depending on the particular protein to be crystallized and the precipitating agent used and usually takes from 12 to 150 hours. As stated, this is necessary in order to produce highly ordered protein crystals for application in X-ray crystallography. Also, once protein in the drop becomes slightly supersaturated and crystal nucleation occurs, as detected by light scattering apparatus 104 (FIGS. 6 and 7), or camera 124 (FIG. 4), the vapor pressure gradient may be adjusted by computer 98 to barely maintain a supersaturated condition in order to prevent more crystal nucleii from forming and to cause dissolved protein in the drop to slowly be deposited around existing nucleii. Additionally, light scattering apparatus 104 and refractometer 100, in conjunction with computer 98, can be used to incrementally adjust the vapor pressure gradient on an infinitesimal level to create a condition in the growth chamber wherein the depletion of protein due to deposition of the same around crystal nucleii precisely matches the evaporation rate of solvent from the drop. In this case, the conversion of dissolved protein to solid protein governs the rate of change of the vapor pressure gradient to allow the slowest rate practical of deposition of protein around the crystal nucleii, allowing macrocrystals of high quality to be grown.

For growing crystals in a microgravity environment, and referring to FIG. 6, crystal growth chambers 78 are each provided with a syringe 86 having an end 87 from which drop 88 is extruded and supported therefrom. A low pressure vacuum source 96 is coupled to outlet tubes 94 and serves to draw spent control fluid from growth chambers 78. Once established in microgravity, syringes 86 are operated to extrude drops 88, and the apparatus is operated as described above.

From the foregoing, it is apparent that the applicants have provided an apparatus within which relatively large protein crystals of high quality may be grown and which may be computer controlled to reduce operator interface therewith. Further, this apparatus may be adapted for use in a microgravity environment, where convection currents and other disruptive effects induced by gravity are eliminated.

We claim:

1. An apparatus for growing crystals from dissolved crystalline material in a selected quantity of fluid comprising:
   an enclosure:
   fluid support means disposed for supporting said selected quantity of fluid in said enclosure;
   a programmable gradient former for selectively generating a flow of control fluid having a selectively variable vapor pressure such that when said flow of control fluid is exposed to said selected quantity of fluid, solvent in said quantity of fluid is varied;
   absorbent vapor diffusion means positioned in said enclosure, said vapor diffusion means being disposed to continuously absorb said flow of control fluid from said gradient former and exposing said selected quantity of fluid to said selectively variable vapor pressure; and
   a discharge opening in said enclosure for passing control fluid therefrom.

2. An apparatus as set forth in claim 1 wherein said absorbent vapor diffusion means includes a sintered glass disc having at least one recess disposed in an upper surface thereof, and said selected quantity of fluid is a drop suspended in said recess, whereby walls of said recess generally surround said drop, providing an increased surface area from which said vapor pressure from said control fuild is exposed to said drop.

3. An apparatus as set forth in claim 2 wherein said enclosure comprises an elongated tubular member having an open upper end, and said sintered glass disc is disposed in said open upper end, and at least one control fluid inlet tube in communicating relation with a bottom surface of said disc, and a control fluid exit tube being disposed in a lower region of said member, whereby said flow of control fluid is absorbed into said sintered glass disc and is conveyed outwardly by capillary action toward interior walls of said member where the control fluid drains downwardly along said walls and exits therefrom via said exit tube.

4. An apparatus as set forth in claim 3 wherein said fluid support means includes a transparent plate sealably disposed over said absorbent vapor diffusion means.

5. An apparatus as set forth in claim 1 including:
   crystalline material concentration detection means disposed proximate said selected quantity of fluid; and
   a computer coupled to said crystalline material concentration detection means and to said control fluid generation means, for detecting concentration of said dissolved crystalline material in said selected quantity of fluid and regulating said vapor pressure responsive to detected changing concentrations of said dissolved crystalline material.

6. An apparatus as set forth in claim 1 including crystal nucleation detection means positioned proximate said selected quantity of fluid and being coupled via said computer to said gradient former, for detecting nucleating crystals in said selected quantity of fluid and regulating said vapor pressure responsive to detected nucleating crystals.

7. An apparatus as set forth in claim 2 wherein a control fluid inlet tube and a control fluid outlet tube are coupled to said member, and at least one sintered glass disc is positioned on a bottom interior side of said enclosure a spaced distance from interior walls thereof, whereby control fluid flows through and around said sintered glass disc in a direction from said inlet tube to said outlet tube.

8. An apparatus as set forth in claim 2 wherein a transparent region is provided in said disc for observing said drop therethrough.

9. An apparatus as set forth in claim 8 wherein a camera is disposed proximate said enclosure for monitoring said drop.

10. An apparatus as set froth in claim 6 wherein said crystal nucleation detection means includes a light scattering detector.

11. An apparatus as set forth in claim 5 wherein said crystalline material concentration detection means includes a refractometer.

12. An apparatus as set forth in claim 3 wherein a plurality of recesses are provided in said sintered glass disc, and said fluid support means includes reservoirs disposed in said recesses, and a transparent plate is provided for covering said open upper end of said tubular member, with said sintered glass disc being supported in said enclosure a spaced distance from said transparent plate, providing a diffusion region wherein said vapor from said control fluid traverses to said reservoirs.

13. An apparatus adapted for use in a microgravity environment for growing crystals from crystalline material dissolved in a selected quantity of fluid comprising:
   a housing having at least one elongated enclosure therein;
   absorbent vapor diffusion means positioned in one end of said enclosure, said vapor diffusion means being provided with a semi-circular vapor diffusion region generally oriented toward an opposite end of said enclosure;
   fluid extrusion and support means disposed in said opposite end of said enclosure for extruding and supporting said selected quantity of fluid proximate said semi-circular diffusion region;
   gradient former for continuously generating a flow of control fluid having a diffusive vapor with controllable properties, said flow of control fluid being in communicating relation with said absorbent vapor diffusion means so that said diffusive vapor is exposed to said selected quantity of fluid; and
   vacuum means communicating with said absorbent vapor diffusion means, for drawing control fluid therefrom.

14. An apparatus as set forth in claim 13 wherein said fluid extrusion and support means comprising a syringe for extruding a drop of fluid containing said dissolved crystalline material, said drop being disposed on an end of said syringe.

15. An apparatus as set forth in claim 14 comprising:
   crystalline material concentration detection means disposed proximate said drop of fluid and being coupled to said control fluid generation means, for determining concentration of dissolved crystalline material in said drop and regulating vapor pressure of said control fluid responsive to detected changing concentrations of dissolved crystalline material in said drop; and crystal nucleation detection means disposed proximate said drop of fluid and being coupled to said control fluid generation means, for detecting nucleating crystals in said drop and regulating said vapor pressure of said control fluid responsive to detected nucleating crystals in said drop.

16. An apparatus as set forth in claim 15 wherein said absorbent vapor diffusion means comprises sintered glass.

* * * * *